United States Patent
Ahmed et al.

(10) Patent No.: US 9,547,043 B2
(45) Date of Patent: Jan. 17, 2017

(54) TEST CONTROL POINT INSERTION AND X-BOUNDING FOR LOGIC BUILT-IN SELF-TEST (LBIST) USING OBSERVATION CIRCUITRY

(71) Applicant: Freescale Semiconductor, Inc., Austin, TX (US)

(72) Inventors: Nisar Ahmed, Bee Cave, TX (US); Orman G. Shofner, Jr., Cedar Park, TX (US)

(73) Assignee: NXP USA, Inc., Austin, TX (US)

( * ) Notice: Subject to any disclaimer, the term of this patent is extended or adjusted under 35 U.S.C. 154(b) by 268 days.

(21) Appl. No.: 13/788,344

(22) Filed: Mar. 7, 2013

(65) Prior Publication Data

US 2014/0258798 A1 Sep. 11, 2014

(51) Int. Cl.
*G01R 31/28* (2006.01)
*G01R 31/3185* (2006.01)
*G01R 31/3177* (2006.01)
*G01R 31/3187* (2006.01)

(52) U.S. Cl.
CPC ... *G01R 31/318547* (2013.01); *G01R 31/3177* (2013.01); *G01R 31/3187* (2013.01)

(58) Field of Classification Search
CPC .............. G01R 31/318547; G01R 31/318385; G01R 31/318536; G01R 31/3187; G01R 31/3177; G01R 31/318533; G01R 31/318544; G06F 11/27; G06F 11/263; G11C 2029/3202
USPC .............. 714/726, 727, 728, 732, 733, 734, 738,714/739, 25, 27, 30
See application file for complete search history.

(56) References Cited

U.S. PATENT DOCUMENTS

| | | | | |
|---|---|---|---|---|
| 6,148,425 | A | * 11/2000 | Bhawmik et al. | 714/726 |
| 6,684,358 | B1 | * 1/2004 | Rajski et al. | 714/739 |
| 7,353,440 | B2 | * 4/2008 | Ohwada et al. | 714/726 |
| 8,086,925 | B2 | 12/2011 | Gass | |
| 2009/0089636 | A1 | * 4/2009 | Fernsler et al. | 714/728 |

OTHER PUBLICATIONS

Gu et al., "An Effort-Minimized Logic BIST Implementation Method", IEEE International Test Conference (ITC), 2001, pp. 1002-1010.
Giles et al., "The Test Features of the Quad-Core AMD Opteron Microprocessor", IEEE International Test Conference (ITC), 2008, pp. 1-10.

\* cited by examiner

*Primary Examiner* — Christine Tu

(57) ABSTRACT

Test control point insertion and x-bounding for Logic Built-In Self-Test (LBIST) using observation circuitry. In some embodiments, LBIST circuitry may include a plurality of test control circuits coupled to a scan chain of a Circuit Under Test (CUT), and a plurality of observation circuits coupled to the test control circuits, each of the plurality of observation circuits including one or more latch devices configured to drive a respective one of the plurality of test control circuits. In other embodiments, a method of testing an integrated circuit may include issuing an instruction that a plurality of observation circuits and a plurality of input/output (I/O) control circuits within the integrated circuit enter a test mode, and providing, one or more test patterns to a selected one or more of a plurality of scan chains within the integrated circuit and to each of the plurality of observation circuits.

16 Claims, 4 Drawing Sheets

TEST CONTROL POINT INSERTION AND X-BOUNDING FOR LOGIC BUILT-IN SELF-TEST (LBIST) USING OBSERVATION CIRCUITRY

FIELD

This disclosure relates generally to electronic devices, and more specifically, to Logic Built-In Self-Test (LBIST) circuitry.

BACKGROUND

The term "Built-in Self-Test" or "BIST" refers to systems and techniques used by a machine or device to test itself. Generally speaking, a goal of a BIST mechanism is to reduce a manufacturer's use of external test equipment in order to determine whether a device works properly. In some cases, a BIST mechanism may also give the manufacturer the ability to test portions of a device that are not otherwise accessible from its exterior. In this context, a "Logic BIST" or "LBIST" is a form of BIST in which hardware and/or software is built into an Integrated Circuit or "IC", thus enabling the IC to test its own operation without relying upon other devices.

To test one or more portions of an IC (referred to as a "Circuit Under Test" or "CUT"), an LBIST controller may introduce a pattern of values into a scan chain (a series of flip-flops or latches) within a given portion during a shifting operation, and then it may observe the results of the propagation during a capture operation. If the captured results reveal an expected "signature," the CUT is determined to be operating properly. Otherwise, the CUT may be deemed defective and corrective action may be taken.

To perform some of these operations, an LBIST controller may access certain points internal to the CUT in order to inject portions of the test pattern at those points; which are also known as "test control points." Additionally or alternatively, the LBIST controller may set inputs to the CUT within the IC to predetermined, known values, in a process referred to as "x-bounding." Traditionally, each test control and x-bounding point has included its own dedicated flip-flop, latch, register, and/or multiplexer.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Disclosed herein are systems and methods for test control point insertion and x-bounding for Logic Built-In Self-Test (LBIST) using observation circuitry. In some embodiments, these systems and methods may reduce the footprint of test control circuits used within an Integrated Circuit (IC) by eliminating or otherwise reducing the number of latches or flip-flops that would otherwise be used. Additionally or alternatively, these systems and methods may reduce the footprint of I/O control circuits within the IC by similarly eliminating or otherwise reducing the number of latches or flip-flops in those I/O control circuits. In various embodiments, observation circuitry within the IC may be configured so as to enable the observation circuitry's own latches or flip-flops to drive logic elements, multiplexers, etc. within test control and/or I/O control circuits.

In many implementations, systems and methods disclosed herein may be incorporated into a wide range of electronic devices including, for example, computer systems or Information Technology (IT) products such as servers, desktops, laptops, switches, routers, etc.; telecommunications hardware; consumer devices or appliances such as mobile phones, tablets, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Figure 1:
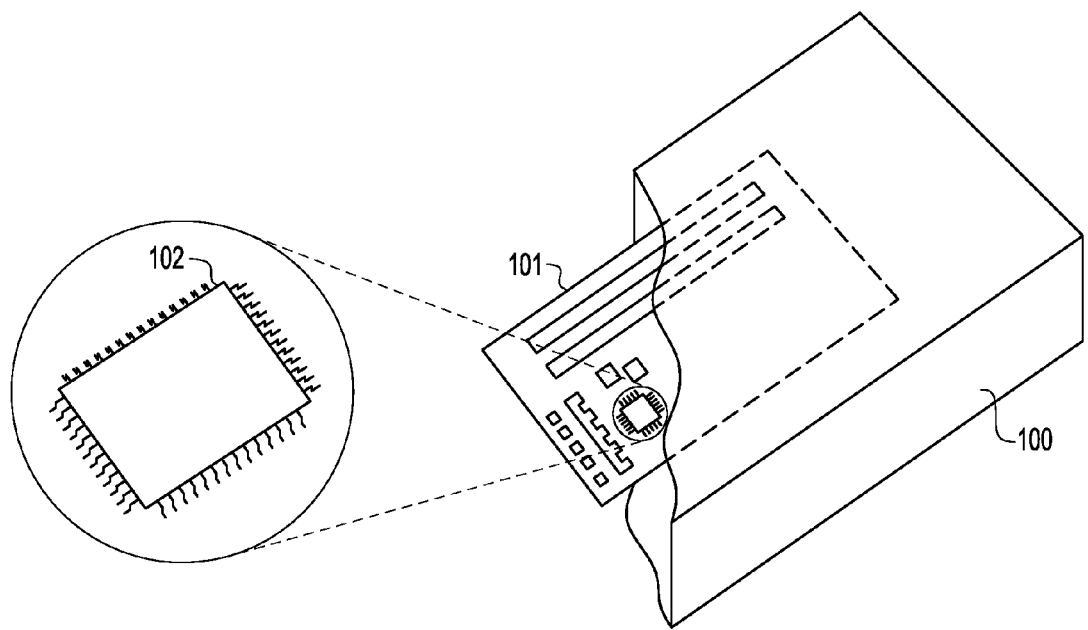
FIG. 1 is a diagram of an example of a Printed Circuit Board (PCB) of a device having one or more electronic chips, according to some embodiments.

Turning to FIG. 1, a block diagram of electronic device 100 is depicted. In some embodiments, electronic device 100 may be any of the aforementioned electronic devices, or any other electronic device. As illustrated, electronic device 100 includes one or more Printed Circuit Boards (PCBs) 101, and at least one of PCBs 101 includes one or more chips 102. In some implementations, one or more ICs within chip 102 may implement systems and methods for test control point insertion and x-bounding, as described in more detail below.

Examples of IC(s) that may be present within chip 102 may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), a Graphics Processing Unit (GPU), or the like. Additionally or alternatively, IC(s) may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate RAM, an Erasable Programmable ROM (EPROM), an Electrically Erasable Programmable ROM (EEPROM), etc. Additionally or alternatively, IC(s) may include one or more mixed-signal or analog circuits, such as, for example, Analog-to-Digital Converter (ADCs), Digital-to-Analog Converter (DACs), Phased Locked Loop (PLLs), oscillators, filters, amplifiers, etc. Additionally or alternatively, IC(s) may include one or more Micro-ElectroMechanical Systems (MEMS), Nano-ElectroMechanical Systems (NEMS), or the like.

Accordingly, an IC within chip 102 may include a number of different portions, areas, or regions. These various portions may include one or more processing cores, cache memories, internal bus(es), timing units, controllers, analog sections, mechanical elements, etc. In various embodiments, the IC may include LBIST circuitry configured to test certain aspects of the IC's operation without relying upon external test equipment. For example, the LBIST circuitry may test one or more logic portions or circuits within the IC during manufacturing, as part of a power-up routine, in a diagnostic procedure, etc.

Generally speaking, chip 102 may include an electronic component package configured to be mounted onto PCB 101 using any suitable packaging technology such as, for example, Ball Grid Array (BGA) packaging or the like. In some applications, PCB 101 may be mechanically mounted within or fastened onto electronic device 100. It should be noted that, in certain implementations, PCB 101 may take a variety of forms and/or may include a plurality of other elements or components in addition to chip 102. It should also be noted that, in some embodiments, PCB 101 may not be used.

Although the example of FIG. 1 shows electronic chip 102 in monolithic form, it should be understood that, in alternative embodiments, the systems and methods described herein may be implemented with discrete components. For example, in some cases, one or more logic gates, multiplexers, latches, flip-flops, etc. may be located outside of chip 102, and one or more of these external components may be operably coupled to an IC fabricated within chip 102.

Figure 2:
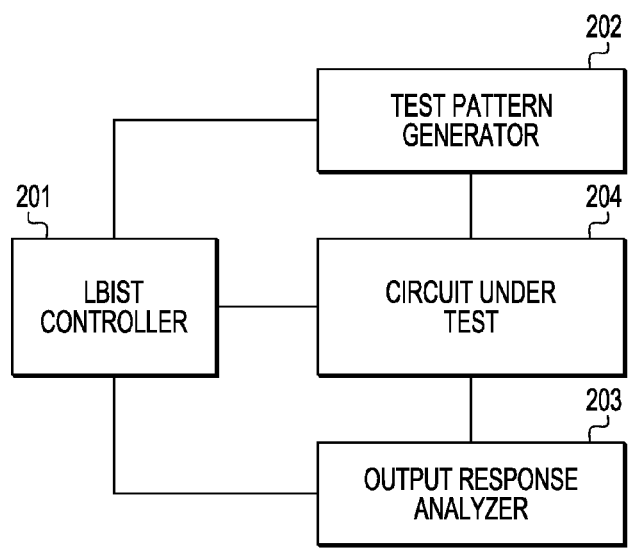
FIG. 2 is a high-level block diagram of an example of portions of an Integrated Circuit (IC) having Logic Built-In Self-Test (LBIST) circuitry according to some embodiments.

FIG. 2 is a high-level block diagram of an example of portions of an IC having LBIST circuitry according to some embodiments. As illustrated, LBIST controller 201 is operably coupled to test pattern generator 202 and to output response analyzer 203. Collectively, LBIST controller 201, test pattern generator 202, and output response analyzer 203 may operate to test one or more logic portions of the IC, here shown as Circuit Under Test (CUT) 204.

Particularly, upon initiation of a test procedure, LBIST controller 201 commands test pattern generator 202 to create one or more test patterns or sequences of logic values ("0s" and "1s"), and it may indicate to CUT 204 that a test is in progress. Test pattern generator 202 may then apply the one or more test patterns or sequences to preselected nodes or points of CUT 204 via corresponding test control circuits 302. Output response analyzer 204 compacts the output responses of CUT 204 into a signature or the like. LBIST controller 201 then compares the signature with a stored, expected signature known to result from the test procedure when CUT 204 is operating in a predetermined, proper or acceptable manner. If the two signatures match each other, the LBIST controller may provide a "pass" indication; otherwise it may provide a "fail" indication.

In various situations, there may be other portions of the IC that are coupled to CUT 204, and that can potentially interfere with the test procedure. These other IC portions are seen as providing unknown or "x" input signals to CUT 204. Therefore, in order to prevent or reduce the effect of unknown sources during testing of CUT 204, those sources may be blocked and/or neutralized by controlling their inputs into CUT 204 in a process referred to as "x-bounding."

Figure 3:
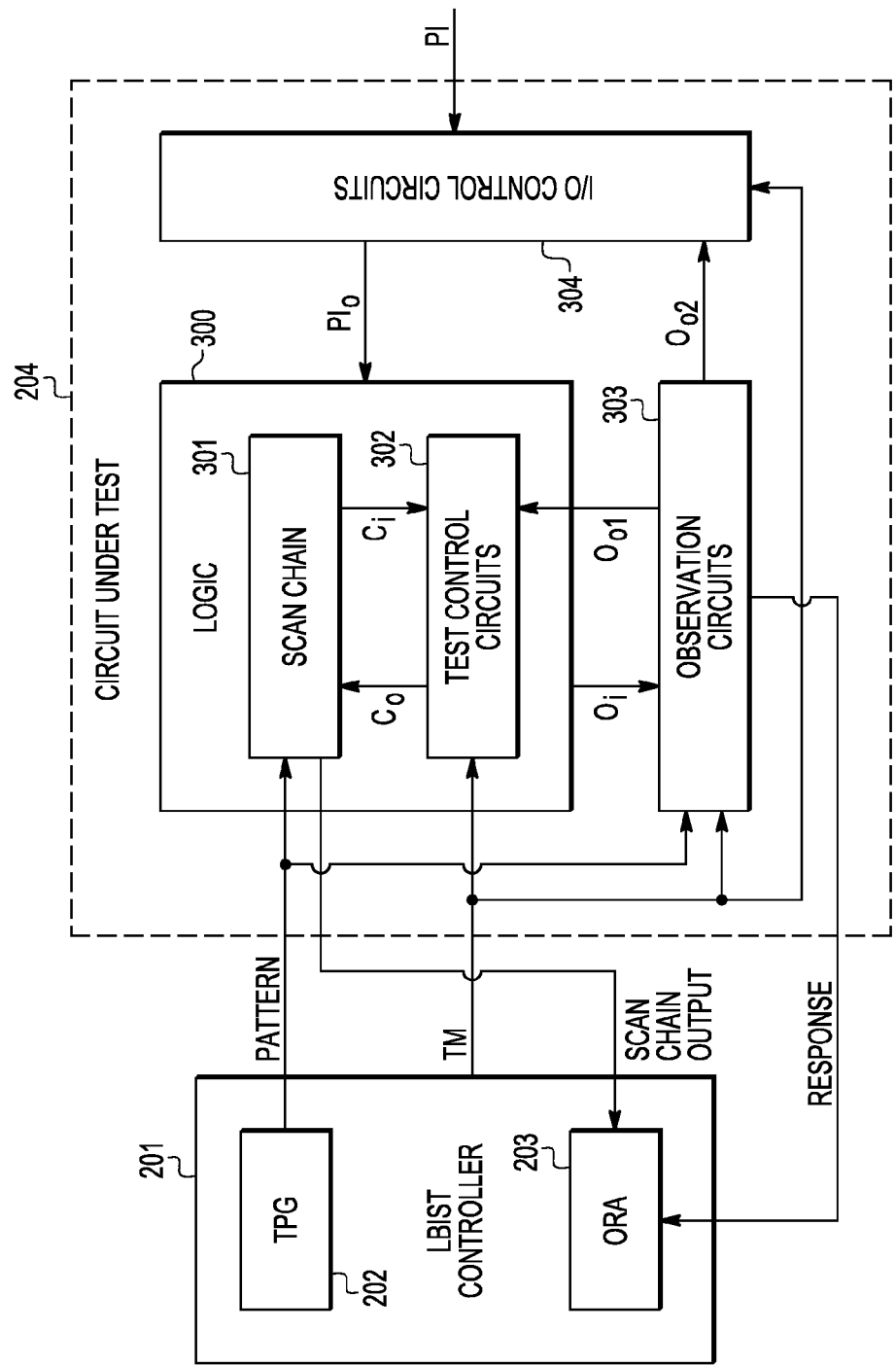
FIG. 3 is a more detailed block diagram of portions of the IC according to some embodiments.

FIG. 3 is a more detailed block diagram of portions of the IC. In this embodiment, test pattern generator 202 and output response analyzer 203 as shown as part of LBIST controller 201. CUT 204 includes CUT logic 300, which represents the portion of CUT 204 to be tested, as well as observation circuits or points 303 and I/O control circuits or points 304. CUT logic 300 in turn includes scan chain 301 and test control circuits or points 302.

Generally speaking, scan chain 301 represents a set of latches or flip-flops within CUT logic 300 that are stitched one after the other to shift data through the circuit, all of these latches of flip-flops operating in a given clock domain. Although only one scan chain is represented in FIG. 3, it should be noted that two or more such chains may be present in a given IC or DUT 204.

Figure 4:
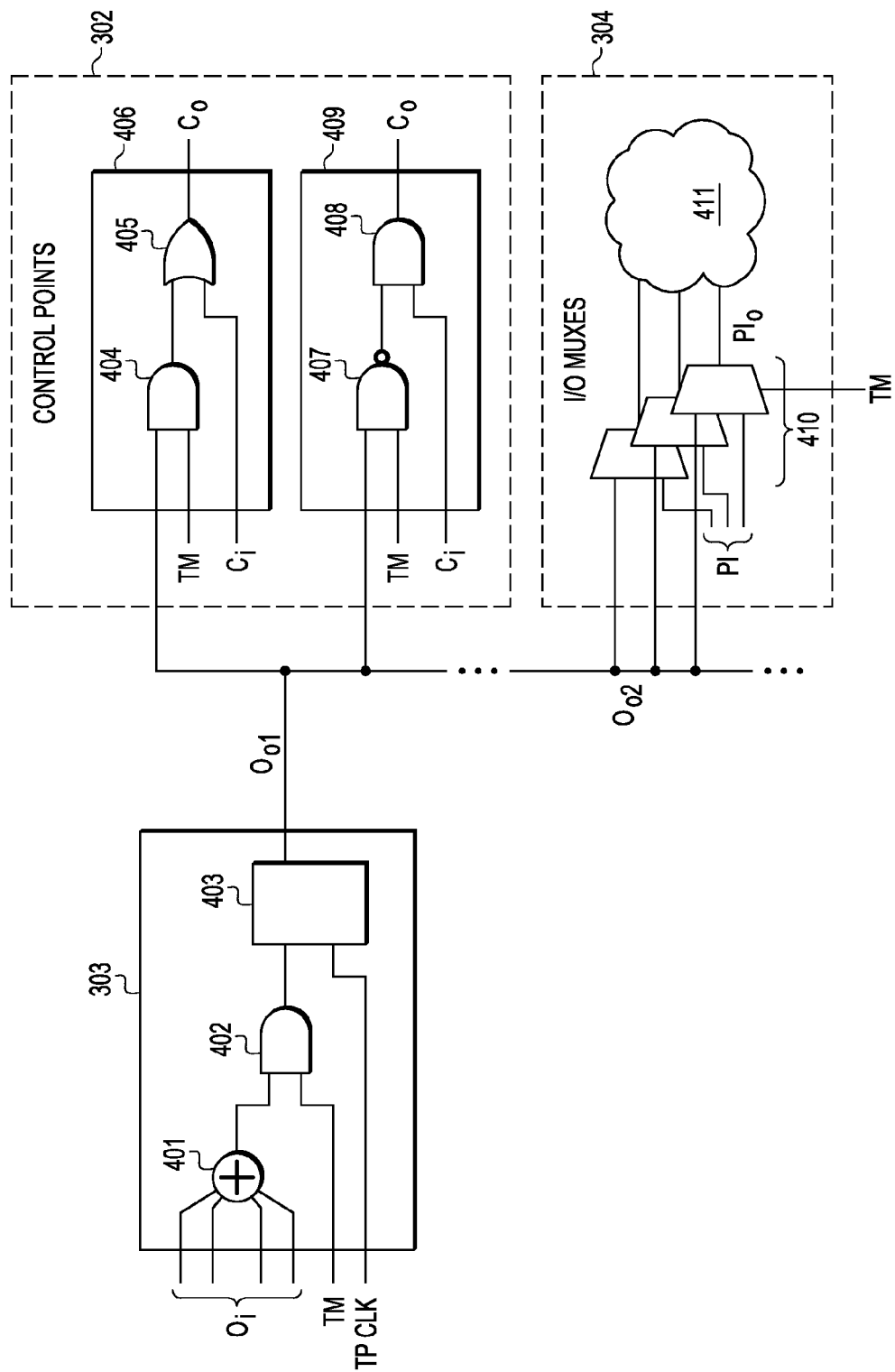
FIG. 4 is a circuit diagram of an example of observation circuitry, test control circuitry and I/O control circuitry according to some embodiments.

Test control circuits 302 are configured to allow LBIST controller 201 to apply values to points internal to CUT logic 300, whereas I/O control circuits 304 are configured to perform x-bounding operations and observation circuits 303 are configured to capture results of a testing procedure. Examples of test control circuits 302, observation circuits 303, and I/O control circuits 304 are shown in FIG. 4 below.

In addition capturing results of a test procedure, observation circuits 303 are also configured to provide test values, patterns, or sequences to test control circuits 302 and/or I/O control circuits 304. Specifically, latches or flip-flop within observation circuits 303 may be used to store values received from test control generator 202 and to be applied to test control circuits 302 and/or I/O control circuits 304, thereby reducing or eliminating the need for latches or flip-flops to be fabricated within test control circuits 302 and/or I/O control circuits 304.

Specifically, at the beginning of a testing procedure, LBIST controller 201 may provide a test mode ("TM") signal to test control circuits 302, observation circuits 303, and/or I/O control circuits 304. Then, as part of a shifting operation, test pattern generator 202 provides test values, patterns, or sequences ("test pattern") to scan chain 301 and to observation circuits 303.

Observation circuits 303 in turn drive test control points 302 with a first observation output signal ($O_{o1}$), and provide a second observation output signal ($O_{o2}$) to I/O control circuits 304 to implement x-bounding. Normally, I/O control circuits 304 receive Primary Input ("PI") signals and provide unknown PI output ("$PI_o$") signals. Here, observation circuits 303 cause I/O control circuits 304 to output known $PI_o$ signals to CUT logic 300 during the testing procedure. With its inputs now known and upon having received $O_{o1}$, still as part of the shifting operation, test control circuits 302 provide control output signals ($C_o$) to scan chain 301 and receive control input ($C_i$) signals in return.

As part of a capture operation following the shifting operation, observation circuits 303 receive control input signals ($C_i$) from CUT logic 300, and provide a response signal ("response") to output response analyzer 203. Output response analyzer 203 in turn analyzes the response signal to create a signature. Then, LBIST controller 201 determines whether the resulting signature matches a stored signature indicating that CUT logic 300 is operating properly. In some cases, scan chain 301 may also be configured to provide scan chain output signal to output response analyzer 203 to provide additional or raw data.

In various embodiments, the modules or blocks shown in FIGS. 2 and 3 may represent processing circuitry, logic functions, and/or data structures. Although these modules are shown as distinct blocks, in other embodiments at least some of the operations performed by these modules may be combined into fewer blocks. Conversely, any given one of the modules of FIGS. 2 and 3 may be implemented such that its operations are divided among two or more logical blocks. Although shown with a particular configuration, in other embodiments these various modules or blocks may be rearranged in other suitable ways.

FIG. 4 is a circuit diagram of an example of observation circuitry 303, test control circuitry 302, and I/O control circuitry 304. In this embodiment, one observation circuit or point 303, two test control circuits or points 406 and 409, and a plurality of I/O control circuits or points 304 are shown for convenience of explanation. It should be noted, however, that in other embodiments any number of observation circuits, test control points, or I/O control circuits may be used.

As illustrated, each of a plurality of observation circuits 303 includes XOR gate 401 configured to receive control input signals $C_i$. The output of XOR gate 401 is coupled to an input of AND gate 402, the other input of which is configured to receive a TM signal (e.g., from LBIST controller 201 in FIG. 3). The output of AND gate 402 is coupled to latch or flip-flop 403, which operates based upon a test clock signal ("TP CLK") discussed below in connection with FIG. 5. Traditionally, control input signals $C_i$ would be received at XOR gate 401 of observation circuit 303 during a capture operation, and then provided to output response analyzer 203 by latch or flip-flop 403 as previously mentioned.

In certain embodiments, however, observation circuit 303 may also be activated prior to or during a shifting operation (therefore prior to the capture operation) in order to drive control points 406 and 409 and/or to perform x-bounding techniques to I/O control points 304. Particularly, the output of latch or flip-flop 403 within observation circuit 303 is coupled to control points 406 and 409 of test control circuits 302, as well as to I/O control circuits 304. In some cases, a same set of observation circuits 303 may provide test value(s), pattern(s), or sequence(s) as observation output signal $O_{o1}$ to test control circuits 302 and also as output signal $O_{o2}$ to I/O control circuits 304. In other cases, a first set of one or more observation circuits 303 may be used to provide $O_{o1}$ and another set may be used to provide $O_{o2}$.

Particularly, the output of latch or flip-flop 403 is coupled to a first input of AND gate 404 of control point 406, the other input of which is configured to receive the TM signal. The output of AND gate 404 is coupled to an input of OR gate 405, the other input of which is configured to receive control input signal $C_i$ from scan chain 301 of FIG. 2. The output of OR gate 408 then provides control output signal $C_o$ to scan chain 301. As such, control point 406 (also known as a 1-control circuit or point) is configured to allow the value of $C_o$ to be forced to a logic high when operating in test mode.

The output of latch or flip-flop 403 is also coupled to a first input of NAND gate 407 of control point 407, the other input of which is configured to receive the TM signal. The output of NAND gate 407 is coupled to an input of AND gate 408, the other input of which is configured to receive control input signal $C_i$ from scan chain 301 of FIG. 2. The output of AND gate 409 then provides control output signal $C_o$ to scan chain 301. As such, control point 406 (also known as a 0-control circuit or point) is configured to allow the value of $C_o$ to be forced to a logic low when operating in test mode.

In addition, the output of latch or flip-flop 403 as well as primary inputs $PI_o$ are coupled to multiplexers 410 of I/O control circuit 304. TM signal is coupled to a selector port of multiplexers 410 to bypass the PI signals and select $O_{o2}$ signals; which are known. The outputs of multiplexers 410 are coupled to other elements 411 within CUT logic 300.

In operation, during a shifting phase, latch or flip-flop 403 within observation circuit 303 may be used to directly drive logic gates 404 and/or 407 of control points 406 and 409 within test control circuit 302. Additionally, latch or flip-flop 403 within observation circuit 303 may be used to directly provide test values, patterns, or sequences to multiplexers 410 within I/O control circuit 304. As such, test control circuitry 302 and/or I/O control circuitry 304 may operate without latches or flip-flops, thus reducing the footprint of the IC. Moreover, the technique shown in FIG. 4 is in contrast with other LBIST architectures where each of control points 406 and 409, and each of multiplexers 410 would have its own latch or flip-flop to store values received from LBIST controller 201 or test pattern generator 202; that is, architectures that do not repurpose latch or flip-flops 403 of observation circuits 303.

Figure 5:
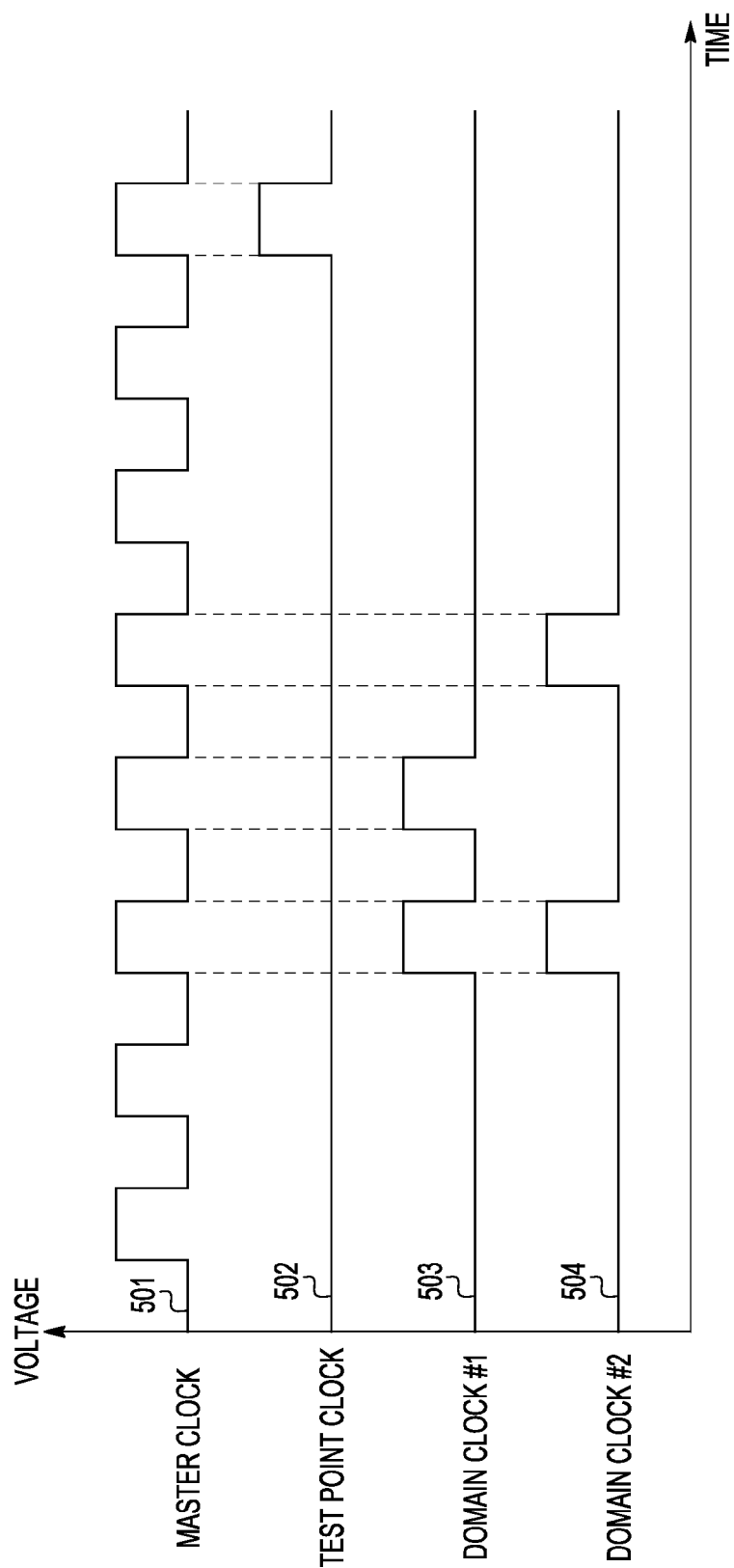
FIG. 5 shows graphs illustrating a capture operation performed by a LBIST circuit according to some embodiments.

FIG. 5 shows graphs illustrating a capture operation performed by a LBIST circuit according to some embodiments. As illustrated, master clock 501 has a particular period or frequency. A first scan chain within CUT 204 operates in a first clock domain (# 1) shown by curve 503, and a second chain within CUT 204 operates in a second clock domain (# 2) shown by curve 504. Here, test point (TP) clock signal 502 provided to the latches or flip-flops 403 of observation circuits 303 causes the capture cycle to occur at the end of a capture window. To this end, TP clock signal 502 may be selected to have a period longer than the periods of the other two clock domains 503 and 504. Again, this approach is in contrast with other LBIST architectures, where an observation circuit operates in the same clock domain of a given scan chain within the IC.

In an illustrative, non-limiting embodiment, LBIST circuitry may include a plurality of test control circuits coupled to a scan chain of a CUT, and a plurality of observation circuits coupled to the test control circuits, each of the plurality of observation circuits including one or more latch devices configured to drive a respective one of the plurality of test control circuits. The LBIST circuitry may also include an LBIST controller operably coupled to the plurality of test control circuits and to the plurality of observation circuits, the LBIST controller configured to provide a test signal to each of the plurality of observation circuits and to each of the plurality of test control circuits, test signal configured to place the observation and test control circuits in a test state.

The LBIST circuitry may further include a test pattern generator operably coupled to the LBIST controller, the scan chain, and the plurality of observation circuits, the test pattern generator configured to provide one or more test patterns to the scan chain and to the plurality of observation circuits. In some cases, the plurality of observation circuits may be configured to apply the one or more test patterns to corresponding ones of the plurality of test control circuits.

The LBIST circuitry may also include an output response analyzer operably coupled to the LBIST controller and to the plurality of observation circuits, the output response analyzer configured to receive one or more response patterns from the plurality of observation circuits and to identify one or more signatures corresponding to the one or more response patterns. The LBIST circuitry may also include a plurality of I/O control circuits operably coupled to the CUT and to the observation circuits, each of the plurality of I/O control circuits lacking latch devices, and the one or more latch devices within each of the plurality of observation circuits configured to drive a respective one of the I/O control circuits.

The LBIST circuitry may further include an LBIST controller operably coupled to the plurality of I/O control circuits and to the plurality of observation circuits, the LBIST controller configured to provide a test signal to each of the plurality of observation circuits and to each of the plurality of I/O control circuits, test signal configured to place the observation and I/O control circuits in a test state.

In another illustrative, non-limiting embodiment, a method of testing an integrated circuit may include issuing, by an LBIST circuit within the integrated circuit, an instruction that a plurality of observation circuits and a plurality of I/O control circuits within the integrated circuit enter a test mode, each of the plurality of observation circuits including one or more flip-flops, and each of the plurality of I/O control circuits lacking flip-flops, and providing, by the LBIST circuit, one or more test patterns to a selected one or more of a plurality of scan chains within the integrated circuit and to each of the plurality of observation circuits. For example, the instruction may be applied to a multiplexer in each of the plurality of I/O control circuits, the instruction configured to cause each multiplexer to select the one or more test patterns instead of an input external to the integrated circuit.

The method may also include applying, by the observation circuits, the one or more test patterns to corresponding ones of the I/O control circuits, the one or more test patterns configured to place the plurality of I/O control circuits in one or more known states. The method may further include receiving, by the LBIST controller, the one or more response patterns from the plurality of observation circuits and identifying one or more signatures corresponding to the one or more response patterns. In some cases, each of the plurality of scan chain may operate in a distinct clock domain, and the receiving may take place with a period longer than other periods of the clock domains of the plurality of scan chains.

The method may also include providing, by the LBIST circuit, the test signal to each of a plurality of test control circuits, the test signal being configured to place the test control circuits in the test mode, and each of the plurality of test control circuits lacking flip-flops. The method may also include providing, by the LBIST circuit, the one or more test patterns to each of a plurality of test control circuits.

In yet another illustrative, non-limiting embodiment, a device may include an electronic circuit and an LBIST circuit operably integrated into the electronic circuit, the LBIST circuit configured to provide a test signal to test control circuits, I/O control circuits, and observation circuits within the electronic circuit, the LBIST circuit configured to provide one or more test sequences to a selected subset of one or more scan chains within the integrated circuit and to the observation circuits, the observation circuits configured to apply the one or more test sequences to the test control circuits and to the I/O control circuits, the LBIST circuit configured to receive results of the one or more test sequences propagated through the selected subset of one or more scan chains, the LBIST circuit configured to determine whether a signature generated based upon the results indicates that the electronic circuit is operating in a predetermined manner.

In some cases, each of the observation circuits may include a latch or flip-flop configured to drive a logic gate circuit within corresponding test control circuits without an intermediate latch or flip-flop during a shifting operation. Also, the latch or flip-flop of the observation circuit may be configured to provide a result of the test sequence during a capture operation. Additionally or alternatively, each of the observation circuits may include a latch or flip-flop configured to provide the one or more test sequences to corresponding I/O control circuits without an intermediate latch or flip-flop during a shifting operation. The latch or flip-flop of the observation circuit may be configured to provide a result of the test sequence during a capture operation.

In some implementations, two or more of the scan chains may operate with different clocks, and the LBIST circuit may be configured to receive the results of the one or more test sequences with clock having a period a period longer than the different clocks.

* * *

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. Logic Built-In Self-Test (LBIST) circuitry, comprising:
   a plurality of test control circuits coupled to a plurality of scan chains; and
   a plurality of observation circuits coupled to the plurality of test control circuits, wherein each of the plurality of observation circuits includes a latch or flip-flop configured to apply at least a portion of a test pattern to a respective one of the plurality of test control circuits, wherein each of the plurality of test control circuits is configured to provide at least a portion of the test pattern to a respective one of the plurality of scan chains, and wherein the latch or flip-flop in each of the plurality of observation circuits is configured to capture at least a portion of a test result of a respective one of the plurality of scan chains.

2. The LBIST circuitry of claim 1, further comprising an LBIST controller operably coupled to the plurality of test control circuits and to the plurality of observation circuits, the LBIST controller configured to provide a test signal to each of the plurality of observation circuits and to each of the plurality of test control circuits, the test signal configured to place the plurality of observation circuits and the plurality of test control circuits in a test state.

3. The LBIST circuitry of claim 2, further comprising a test pattern generator operably coupled to the LBIST controller and to the plurality of observation circuits, the test pattern generator configured to provide the one or more test patterns to the plurality of observation circuits when the plurality of observation circuits and the plurality of test control circuits are in the test state.

4. The LBIST circuitry of claim 3, wherein the latch or flip-flop in each of the plurality of observation circuits is coupled to two or more the plurality of test control circuits, wherein each of the two or more of the plurality of test control circuits does not have any flip-flops or latches, and wherein each of the two or more of the plurality of test control circuits is configured to provide the test pattern to the respective one of the plurality of scan chains while the two or more of the plurality of test control circuits are in the test state.

5. The LBIST circuitry of claim 4, further comprising an output response analyzer operably coupled to the LBIST controller and to the plurality of observation circuits, the output response analyzer configured to receive one or more response patterns from the plurality of observation circuits and to identify one or more signatures corresponding to the one or more response patterns.

6. The LBIST circuitry of claim 1, further comprising a plurality of input/output (I/O) control circuits operably coupled to the plurality of observation circuits, wherein each of the plurality of I/O control circuits does not have any flip-flop or latch devices, and wherein the latches or flip-flops within the plurality of observation circuits are further configured to drive respective ones of the I/O control circuits.

7. The LBIST circuitry of claim 6, further comprising an LBIST controller operably coupled to the plurality of I/O control circuits and to the plurality of observation circuits, the LBIST controller configured to provide a test signal to each of the plurality of observation circuits and to each of the plurality of I/O control circuits, the test signal configured to place the observation and I/O control circuits in a test state.

8. A method comprising:
issuing, by a Logic Built-In Self-Test (LBIST) circuit within an integrated circuit, a signal configured to instruct a plurality of observation circuits and a plurality of input/output (I/O) control circuits within the integrated circuit to enter a test mode, wherein each of the plurality of observation circuits includes a flip-flop configured to provide at least a portion of a test pattern to a respective one of the plurality of I/O control circuits, wherein each of the flip-flops is further configured to store a response to the respective portion of the test pattern received from the respective one of the plurality of I/O circuit, and wherein each of the plurality of I/O control circuits does not have any flip-flops; and
providing the test pattern by the LBIST circuit to the plurality of observation circuits.

9. The method of claim 8, wherein the signal is applied to a multiplexer in each of the plurality of I/O control circuits, the signal configured to cause each multiplexer to select the test pattern instead of an input external to the integrated circuit.

10. The method of claim 8, further comprising applying, by the observation circuits, the test pattern to the plurality of I/O control circuits, wherein the test pattern, applied by the plurality of observation circuits, is configured to place the plurality of I/O control circuits in one or more known states.

11. The method of claim 10, further comprising receiving, by the LBIST circuit, responses from the plurality of observation circuits and identifying one or more signatures corresponding to the response.

12. The method of claim 8, further comprising providing, by the LBIST circuit, a test signal to each of a plurality of test control circuits, wherein the test signal is configured to place the test control circuits in the test mode, wherein each of the plurality of test control circuits is configured to provide a respective portion of the test pattern received directly from a respective one of the flip-flops to a portion of the integrated circuit when two or more of the plurality of test control circuits are in a test state.

13. A device, comprising:
an electronic circuit; and
a Logic Built-In Self-Test (LBIST) circuit operably integrated into the electronic circuit, the LBIST circuit configured to provide a test signal to test control circuits, input/output (I/O) control circuits, and observation circuits within the electronic circuit, wherein the test control circuits are configured to apply logic values to points internal to the electronic circuit as part of a test procedure, wherein the I/O control circuits are configured to perform x-bounding operations as part of the test procedure, wherein the observation circuits are configured to capture results of the testing procedure, wherein the test signal is configured to put the test control circuits, I/O control circuits, and observation circuits in a test state, wherein the LBIST circuit is configured to provide a test sequence to the observation circuits, wherein each given one of the test control circuits is configured to provide at least a portion of the test sequence received from a respective one of the observation circuits to a portion of the electronic circuit while the given one of the test control circuits is in the test state, wherein each of the observation circuits includes a latch or flip-flop configured to receive at least a portion of the test sequence and to subsequently receive a given result of the portion of the test sequence propagated through the portion of the electronic circuit, and wherein the LBIST circuit is configured to determine whether a signature generated based upon the given result indicates that the electronic circuit is operating properly.

14. The device of claim 13, wherein the & latch or flip-flop is configured to provide the test sequence directly to a logic gate circuit within the test control circuit without any intermediate latches or flip-flops during a shifting operation.

15. The device of claim 14, wherein each of the latches or flip-flops is configured to receive a respective result of a respective portion of the test sequence propagated through a respective portion of the electronic circuit through one or more scan chains during a capture operation.

16. The device of claim 15, wherein the one or more scan chains operate with different clocks, and wherein the LBIST circuit is configured to operate with a clock having a period longer than any clock with which the one or more scan chains operate.

* * * * *